(12) United States Patent
Hardiman et al.

(10) Patent No.: US 12,382,699 B2
(45) Date of Patent: Aug. 5, 2025

(54) PLASMA-BASED BARRIER LAYER REMOVAL METHOD FOR INCREASING PEAK TRANSCONDUCTANCE WHILE MAINTAINING ON-STATE RESISTANCE AND RELATED DEVICES

(71) Applicant: MACOM Technology Solutions Holdings, Inc., Lowell, MA (US)

(72) Inventors: Chris Hardiman, Morrisville, NC (US); Kyoung-Keun Lee, Cary, NC (US); Kyle Bothe, Cary, NC (US); Fabian Radulescu, Chapel Hill, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 574 days.

(21) Appl. No.: 17/834,144

(22) Filed: Jun. 7, 2022

(65) Prior Publication Data

US 2023/0395670 A1   Dec. 7, 2023

(51) Int. Cl.
*H10D 64/27*      (2025.01)
*H01L 21/285*    (2006.01)
*H10D 30/01*      (2025.01)
*H10D 30/47*      (2025.01)
(Continued)

(52) U.S. Cl.
CPC ..... *H10D 64/411* (2025.01); *H01L 21/28581* (2013.01); *H10D 30/015* (2025.01); *H10D 30/475* (2025.01); *H10D 62/824* (2025.01); *H10D 62/8503* (2025.01)

(58) Field of Classification Search
CPC ......... H01L 29/42316; H01L 21/28581; H01L 29/2003; H01L 29/205; H01L 29/66462; H01L 29/7786; H01L 23/047; H01L 23/3107; H01L 23/3171; H01L 21/28587; H01L 21/30621; H01L 23/3192; H01L 29/0657; H01L 23/4824; H01L 29/0843; H01L 29/41766
See application file for complete search history.

(56) References Cited

U.S. PATENT DOCUMENTS 5,210,051 A   5/1993   Carter
5,393,993 A   2/1995   Edmond et al.
5,523,589 A   6/1996   Edmond et al.
(Continued)

OTHER PUBLICATIONS

Notification of Transmittal of the International Search Report and the Written Opinion of the International Searching Authority, or the Declaration, in corresponding PCT Application No. PCT/US2023/067826 (Sep. 28, 2023).

*Primary Examiner* — Allison Bernstein
(74) *Attorney, Agent, or Firm* — Myers Bigel, P.A.

(57) ABSTRACT

A transistor device includes a semiconductor structure comprising a channel layer and a barrier layer; source and drain contacts on the semiconductor structure; and a gate on the semiconductor structure between the source and drain contacts. A first portion of the barrier layer extending between the source or drain contact and the gate has a first thickness, a second portion of the barrier layer between the gate and the channel layer has a second thickness, and the first thickness is about 1.5 times to 4 times greater than the second thickness. Related methods of fabrication using a looped recess process are also discussed.

28 Claims, 8 Drawing Sheets

(51) Int. Cl.
    *H10D 62/824*     (2025.01)
    *H10D 62/85*     (2025.01)

(56) References Cited

U.S. PATENT DOCUMENTS

| | | | |
|---|---|---|---|
| 6,548,333 | B2 | 4/2003 | Smith |
| 7,859,021 | B2 * | 12/2010 | Kaneko ............. H01L 29/42316 |
| | | | 257/361 |
| 8,124,505 | B1 | 2/2012 | Burnham et al. |
| 8,563,372 | B2 | 10/2013 | Hagleitner et al. |
| 8,592,868 | B2 | 11/2013 | Heikman et al. |
| 9,214,352 | B2 | 12/2015 | Hagleitner et al. |
| 9,312,350 | B2 * | 4/2016 | Minoura ............... H01L 29/045 |
| 9,343,543 | B2 | 5/2016 | Radulescu et al. |
| 9,343,561 | B2 | 5/2016 | Radulescu |
| 9,368,609 | B2 * | 6/2016 | Okamoto ............ H01L 29/7786 |
| 9,450,081 | B2 | 9/2016 | Wu et al. |
| 9,608,078 | B2 | 3/2017 | Hagleitner et al. |
| 9,640,623 | B2 | 5/2017 | Hagleitner |
| 9,666,707 | B2 | 5/2017 | Sheppard et al. |
| 9,773,877 | B2 | 9/2017 | Wu et al. |
| 10,600,710 | B2 * | 3/2020 | Prechtl ................ H01L 29/4236 |
| 2012/0261720 | A1 | 10/2012 | Puglisi et al. |
| 2014/0021511 | A1 | 1/2014 | Jeon et al. |
| 2014/0361342 | A1 | 12/2014 | Sriram et al. |
| 2016/0358782 | A1 | 12/2016 | Yang et al. |
| 2017/0338122 | A1 | 11/2017 | Daulton |
| 2021/0217884 | A1 * | 7/2021 | MacElwee .......... H01L 29/7786 |
| 2021/0320197 | A1 | 10/2021 | Tang et al. |
| 2024/0363745 | A1 * | 10/2024 | Gupta ................ H01L 29/2003 |

\* cited by examiner

PLASMA-BASED BARRIER LAYER REMOVAL METHOD FOR INCREASING PEAK TRANSCONDUCTANCE WHILE MAINTAINING ON-STATE RESISTANCE AND RELATED DEVICES

FIELD

The inventive concepts described herein relate to semiconductor devices, and more particularly, to transistor devices and related fabrication methods.

BACKGROUND

Power semiconductor devices are widely used to carry large currents, support high voltages and/or operate at high frequencies such as radio frequencies. A wide variety of power semiconductor devices are known in the art including, for example, power switching devices and power amplifiers. Many power semiconductor devices are implemented using various types of field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

Modern power semiconductor devices are generally fabricated from wide bandgap semiconductor materials (i.e., having a band-gap greater than 1.40 eV). For example, power HEMTs may be fabricated from gallium nitride (GaN) or other Group III nitride based material systems that are formed on a silicon carbide (SiC) substrate. As used herein, the term "Group III nitride" refers to those semiconducting compounds formed between nitrogen and the elements in Group III of the periodic table, usually aluminum (Al), gallium (Ga), and/or indium (In). These compounds have empirical formulas in which one mole of nitrogen is combined with a total of one mole of the Group III elements. For high power, high temperature, and/or high frequency applications, devices formed in wide bandgap semiconductor materials such as silicon carbide (2.996 eV bandgap for alpha silicon carbide at room temperature) and the Group III nitrides (e.g., 3.36 eV bandgap for gallium nitride at room temperature) may provide higher electric field breakdown strengths and higher electron saturation velocities as compared to gallium arsenide (GaAs) and silicon (Si) based devices.

In order to increase the output power and current handling capabilities, power semiconductor devices may be implemented in a "unit cell" configuration in which a large number of individual unit cell transistor structures of the active region are electrically connected (e.g., in parallel) to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated.

Field effect transistors such as HEMTs and MOSFETs may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. Conventional high performance Group III nitride-based HEMTs may typically be implemented as depletion mode (normally-on) devices, in that they are conductive at a gate-source bias of zero due to the polarization-induced charge at the interface of the barrier and channel layers of the device.

When a HEMT device is in an ON-state, a two-dimensional electron gas (2DEG) is formed at the heterojunction of two semiconductor materials with different bandgap energies, where the smaller bandgap material has a higher electron affinity. The 2DEG is an accumulation layer in the undoped ("unintentionally doped") smaller bandgap material and can contain a very high sheet electron concentration. Additionally, electrons that originate in the wider-bandgap semiconductor material transfer to the 2DEG layer, allowing high electron mobility due to reduced ionized impurity scattering. This combination of high carrier concentration and high carrier mobility can give the HEMT a very large transconductance (which may refer to the relationship between output current and input voltage) and may provide a strong performance advantage over MOSFETs for high-frequency applications.

High electron mobility transistors fabricated in Group III-nitride based material systems also have the potential to generate large amounts of radio frequency (RF) power because of the combination of material characteristics that includes the aforementioned high breakdown fields, wide bandgaps, large conduction band offset, and/or high saturated electron drift velocity. As such, Group III-Nitride based HEMTs may be promising candidates for high power RF applications, as well as for low frequency high power switching applications. However, problems may arise as device integration increases. For example, a HEMT may be subject to short channel effects (SCE) as gate length is reduced.

SUMMARY

According to some embodiments, a transistor device includes a semiconductor structure comprising a channel layer and a barrier layer, source and drain contacts on the semiconductor structure, and a gate on the semiconductor structure between the source and drain contacts. A first portion of the barrier layer extending between the source or drain contact and the gate has a first thickness, a second portion of the barrier layer between the gate and the channel layer comprises a floor of a gate recess and has a second thickness, and the first thickness is about 1.5 times to 4 times greater than the second thickness.

In some embodiments, the first thickness is about 150 Å to 300 Å, and the second thickness is about 30 Å to 150 Å.

In some embodiments, a surface roughness along the floor of the gate recess is less than about 3 Å.

In some embodiments, the floor of the gate recess defines a length of the gate between the source and drain contacts, and a ratio of the length of the gate to the second thickness is about 10:1 or less. In some embodiments, the length of the gate is less than about 100 nanometers (nm).

In some embodiments, the second thickness of the barrier layer is less than a third thickness of the barrier layer at corner portions of the gate recess adjacent opposing sidewalls thereof.

In some embodiments, the opposing sidewalls respectively comprise a first portion defining an angle of about 85 degrees to about 95 degrees relative to the floor, and a second portion defining an angle of about 40 degrees to 50 degrees relative to the floor.

In some embodiments, the barrier layer comprises a gallium-based material.

In some embodiments, a peak transconductance ($g_m$) of the transistor device is greater than about 400 mS/mm (e.g., about 450 mS/mm to 800 mS/mm, about 500 mS/mm to 600 mS/mm, or about 510 mS/mm to 550 mS/mm), and an on-resistance of the transistor device is about 1.5 Ω-mm to 3 Ω-mm.

According to some embodiments, a transistor device includes a semiconductor structure comprising a channel layer and a barrier layer, and source and drain contacts and a gate therebetween on the semiconductor structure. The barrier layer includes a gate recess having the gate therein, and wherein a surface roughness along a floor of the gate recess is less than about 3 Angstroms (Å).

In some embodiments, the barrier layer comprises a gallium-based material.

In some embodiments, a first thickness of the barrier layer at corner portions of the gate recess adjacent opposing sidewalls thereof is greater than a second thickness of the barrier layer at the floor of the gate recess.

In some embodiments, the opposing sidewalls respectively comprise a first portion defining an angle of about 85 degrees to about 95 degrees relative to the floor, and a second portion defining an angle of about 40 degrees to 50 degrees relative to the floor.

In some embodiments, a third thickness of a portion of the barrier layer extending between the source or drain contact and the gate is about 1.5 times to 4 times greater than the second thickness.

According to some embodiments, a transistor device includes a semiconductor structure comprising a channel layer and a barrier layer, and source and drain contacts and a gate therebetween on the semiconductor structure. A first portion of the barrier layer extending between the source or drain contact and the gate has a first thickness, a second portion of the barrier layer between the gate and the channel layer has a second thickness and defines a length of the gate between the source and drain contacts, and a ratio of the length of the gate to the second thickness is about 10:1 or less.

In some embodiments, the first thickness is about 1.5 times to 4 times greater than the second thickness.

In some embodiments, the first thickness is about 150 Å to 300 Å, and the second thickness is about 30 Å to 150 Å.

In some embodiments, the length of the gate is less than about 100 nanometers (nm).

In some embodiments, a peak transconductance ($g_m$) of the transistor device is greater than about 400 mS/mm (e.g., about 450 mS/mm to 800 mS/mm, about 500 mS/mm to 600 mS/mm, or about 510 mS/mm to 550 mS/mm), and an on-resistance of the transistor device is about 1.5 Ω-mm to 3 Ω-mm.

According to some embodiments, a transistor device includes a semiconductor structure comprising a channel layer and barrier layer defining a heterojunction therebetween, and source and drain contacts and a gate therebetween on the semiconductor structure. A peak transconductance ($g_m$) of the transistor device is greater than about 400 mS/mm, and an on-resistance of the transistor device is about 1.5 Ω-mm to 3 Ω-mm. For example, the peak transconductance ($g_m$) of the transistor device may be greater than about 400 mS/mm (e.g., about 450 mS/mm to 800 mS/mm, about 500 mS/mm to 600 mS/mm, or about 510 mS/mm to 550 mS/mm).

In some embodiments, the channel layer and the barrier layer comprise a gallium-based material.

In some embodiments, a first portion of the barrier layer extending between the source or drain contact and the gate has a first thickness, a second portion of the barrier layer between the gate and the channel layer has a second thickness and defines a length of the gate between the source and drain contacts, and a ratio of the length of the gate to the second thickness is about 10:1 or less. In some embodiments, the first thickness is about 1.5 times to 4 times greater than the second thickness. In some embodiments, the first thickness is about 150 Å to 300 Å, and the second thickness is about 30 Å to 150 Å.

According to some embodiments, a transistor device includes a semiconductor structure comprising a channel layer and a barrier layer, and source and drain contacts and a gate therebetween on the semiconductor structure. The barrier layer comprises a gate recess including the gate therein, the gate recess comprises opposing sidewalls and a floor therebetween, and a first thickness of the barrier layer at edges of the gate recess adjacent the opposing sidewalls is greater than a second thickness of the barrier layer at the floor of the gate recess therebetween.

In some embodiments, the edges comprise inclined surfaces, and the floor comprises a substantially planar surface that is between the inclined surfaces.

In some embodiments, the opposing sidewalls respectively comprise a first portion defining an angle of about 85 degrees to about 95 degrees relative to the floor, and a second portion comprising the inclined surfaces having an angle of about 40 degrees to 50 degrees relative to the floor.

In some embodiments, a third thickness of a portion of the barrier layer extending between the source or drain contact and the gate is about 1.5 times to 4 times greater than the second thickness.

In some embodiments, the barrier layer comprises a gallium-based material.

In some embodiments, a surface roughness along the floor of the gate recess is less than about 3 Å.

According to some embodiments, a method of fabricating a transistor device includes providing a semiconductor structure comprising a channel layer and a barrier layer, performing a looped recess process to define a gate recess in the barrier layer, and forming a gate in the gate recess.

In some embodiments, the looped recess process includes a plurality of loops that are configured to remove, layer-by-layer, a portion of the barrier layer to define the gate recess therein.

In some embodiments, the looped recess process is a plasma etch process, and wherein each of the loops is configured to remove a monolayer of the barrier layer.

In some embodiments, each of the loops includes an adsorption process and a desorption process with a purge process therebetween. In some embodiments, the adsorption process is chlorine-based, the desorption process is argon-based, and the purge process is helium- or nitrogen-based.

In some embodiments, the channel layer and the barrier layer comprise a gallium-based material, and the barrier layer has a higher bandgap than that of the channel layer.

In some embodiments, the plasma etch process is performed using an inductively-coupled plasma tool with a peak-to-peak voltage of about 70 V to 110 V.

In some embodiments, prior to performing the looped recess process, a passivation layer is formed on the semiconductor structure, and an opening is formed in the passivation layer that exposes a surface of the barrier layer.

In some embodiments, spacers are formed on opposing sidewalls of the opening in the passivation layer prior to performing the looped recess process.

In some embodiments, spacers are formed on opposing sidewalls of the opening in the passivation layer after performing the looped recess process.

In some embodiments, responsive to performing the looped recess process, a surface roughness along a floor of the gate recess is less than about 3 Å.

In some embodiments, source and drain contacts are formed on the semiconductor structure. A first portion of the barrier layer extending between the source or drain contact and the gate has a first thickness of about 150 Angstroms (Å) to 300 Å, and a second portion of the barrier layer comprising a floor of the gate recess has a second thickness of less than about 150 Å.

In some embodiments, a ratio of a length of the gate between the source and drain contacts along the floor of the gate recess to the second thickness is about 10:1 or less. In some embodiments, the length of the gate is less than about 100 nanometers (nm).

In some embodiments, responsive to performing the looped recess process, a first thickness of the barrier layer at corner portions of the gate recess adjacent opposing sidewalls thereof is greater than a second thickness of the barrier layer at a floor of the gate recess.

In some embodiments, the opposing sidewalls respectively comprise a first portion defining an angle of about 85 degrees to about 95 degrees relative to the floor, and a second portion defining an angle of about 40 degrees to 50 degrees relative to the floor.

In some embodiments, a peak transconductance ($g_m$) of the transistor device is greater than about 400 mS/mm (e.g., about 450 mS/mm to 800 mS/mm, about 500 mS/mm to 600 mS/mm, or about 510 mS/mm to 550 mS/mm), and an on-resistance of the transistor device is about 1.5 Ω-mm to 3 Ω-mm.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Figure 1A:
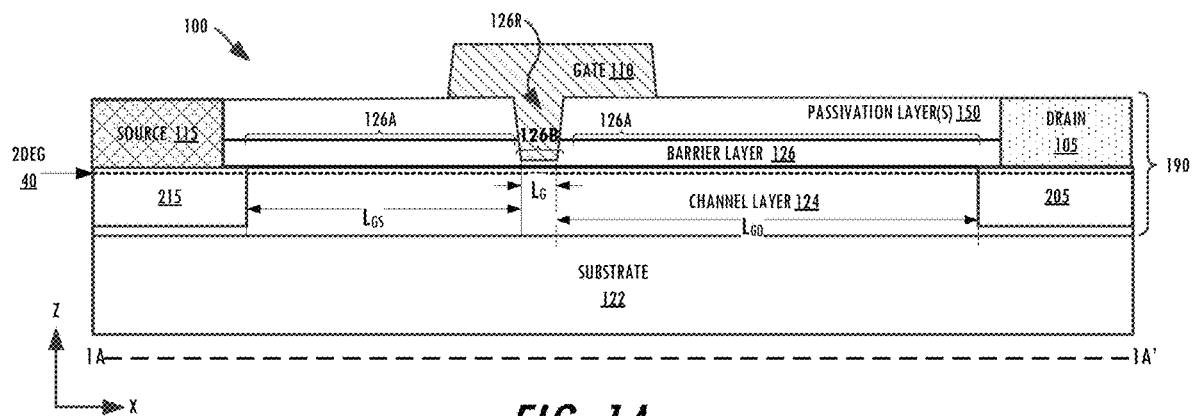
FIG. 1A is a schematic cross-sectional view illustrating a transistor device according to some embodiments of the present invention.

Power transistor devices as described herein may include both discrete devices that are coupled with other circuitry such as, for example, impedance matching networks, or as MMIC devices (e.g., a multi-stage HEMT amplifier with built-in impedance matching networks). FIG. 1A is a schematic cross-sectional view illustrating a transistor device according to some embodiments of the present invention, illustrated by way of example with reference to unit cell transistor structures 100 (also referred to herein as a transistor structure or transistor cell) of a transistor device, such as a HEMT. As shown in FIG. 1A, a transistor structure 100 is formed on a substrate 122 such as, for example, a silicon carbide substrate. Hundreds or thousands of unit cell transistor structures 100 may be formed on the semiconductor substrate 122, and may be electrically connected (e.g., in parallel) to provide the HEMT device.

The substrate 122 may be a semi-insulating silicon carbide substrate that may be, for example, the 4H polytype of silicon carbide. Other silicon carbide candidate polytypes may include the 3C, 6H, and 15R polytypes. Although silicon carbide may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 122 may be a SiC wafer, and the HEMT device may be formed, at least in part, via wafer-level processing. The wafer may then be diced or otherwise singulated to provide a multiple dies, where each die includes a plurality of the unit cell transistor structures 100.

The transistor structure 100 includes a channel layer 124 on the substrate 122, and a barrier layer 126 on the channel layer 124 opposite the substrate 122. Source and drain electrodes (also referred to herein as source and drain contacts) 115 and 105 are formed laterally (e.g., along the X-direction) spaced apart from each other. The source contact 115 and the drain contact 105 may form ohmic contact to the barrier layer 126 or to the channel layer 124.

One or more insulator layers (for example, one or more passivation layers) 150 are formed on the barrier layer 126, and a gate contact (or simply "gate") 110 is formed on the barrier layer 126 between the source and drain contacts 115 and 105. The gate 110 may be formed closer to the source contact 115, such that the gate-to-source length $L_{GS}$ may be smaller than the gate-to-drain length $L_{GD}$ in some embodiments. Depending on configuration, one or more of the insulator layers 150 may be formed before and/or after formation of the gate 110.

The channel layer 124 may have a bandgap that is less than the bandgap of the barrier layer 126 and the channel layer 124 may also have a larger electron affinity than the barrier layer 126. The channel layer 124 and barrier layer 126 may together define a semiconductor structure 190, with the source contact 115, the drain contact 105, and the gate 110 formed on the semiconductor structure 190. In the illustrated examples, the semiconductor structure 190 may be a semiconductor layer structure including one or more layers formed by epitaxial growth, and thus include one or more epitaxial layers 124, 126. Techniques for epitaxial growth of Group III nitrides have been described in, for example, U.S. Pat. Nos. 5,210,051, 5,393,993, and 5,523,589, the disclosures of which are also incorporated by reference herein in their entireties.

In the illustrated HEMT device 100, the semiconductor layer structure 190 may be Group-III nitride based, although other material systems can also be used. As noted above, Group III nitrides may refer to semiconductor compounds formed between nitrogen and the elements in the Group III of the periodic table, such as aluminum (Al), gallium (Ga), and/or indium (In), and may form binary (e.g., GaN), ternary (e.g., AlGaN, AlInN), and quaternary (e.g., AlInGaN) compounds. Accordingly, formulas such as $Al_xGa_{1-x}N$, where $0 \leq x \leq 1$, may be used to describe these compounds. One or both of the channel layer 124 and the barrier layer 126 may include sub-layers including doped or undoped (i.e., "unintentionally doped") layers of Group III-nitride materials, including material compositions which may be stepwise or continuously graded. For example, the channel layer 124 may be a multi-layer structure, such as a superlattice or combinations of GaN, AlGaN or the like. The channel layer 124 may be under compressive strain in some embodiments. The barrier layer 126 may comprise a single layer or may be a multi-layer structure. In particular embodiments of the present disclosure, the barrier layer 126 may be thick enough and may have a high enough aluminum (Al) composition and doping to induce a significant carrier concentration at the interface between the channel layer 124 and the barrier layer 126 through polarization effects when the barrier layer 126 is buried under ohmic contact metal.

While semiconductor structure 190 is shown with reference to one or more epitaxial layers 124, 126 for purposes of illustration, the semiconductor structure 190 may include additional layers/structures/elements such as isolation layer(s), buffer and/or nucleation layer(s) on or between substrate 122 and the one or more epitaxial layers 124, and/or a cap layer on an upper surface of the epitaxial layer 126. For example, an AlN buffer layer may be formed on the upper surface of the substrate 122 to provide an appropriate crystal structure transition between the silicon carbide substrate 122 and the remainder of the layers of the semiconductor structure 190. Additionally, strain balancing transition layer(s) may also and/or alternatively be provided. The optional buffer/nucleation/transition layers, as well as the channel layer 124 and/or the barrier layer 126, may be deposited, for example, by metal-organic chemical vapor deposition (MOCVD), molecular beam epitaxy (MBE), and/or hydride vapor phase epitaxy (HVPE).

The material of the gate 110 may be chosen based on the composition of the semiconductor structure 190, and may, in some embodiments, be a Schottky contact. Some materials capable of making a Schottky contact to a Group III nitride based semiconductor material that may be used as the gate 110 may include, for example, nickel (Ni), platinum (Pt), nickel silicide (NiSix), copper (Cu), palladium (Pd), chromium (Cr), tungsten (W) and/or tungsten silicon nitride (WSiN).

The source contact 115 and/or the drain contact 105 may include a metal that can form an ohmic contact to the semiconductor material of the structure 190. For example, a conductive metal material may be deposited and annealed (e.g., at a temperature of about 600° C. to 1050° C.) to form the ohmic contacts. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSix, titanium silicide (TiSi), titanium nitride (TiN), WSiN, Pt and the like. Thus, the source contact 115 and/or the drain contact 105 may contain an ohmic contact portion in direct contact with the layer 124 and/or 126. In some embodiments, the source contact 115 and/or the drain contact 105 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

In operation, a 2DEG layer 40 may be formed at a junction between the channel layer 124 and the barrier layer 126 when the HEMT device is biased to be in its conducting or "on" state. The 2DEG layer 40 acts as a highly conductive channel that allows current to flow between the source and drain regions that are beneath the source contact 115 and the drain contact 105, respectively. In particular, the channel layer 124 and the barrier layer 126 of the semiconductor structure 190 may be formed of materials having different bandgaps, such that a heterojunction is defined at an interface between the channel layer 124 and the barrier layer 126. The 2DEG conduction channel 40 can be induced at the heterointerface between the channel layer 124 and the barrier layer 126. The channel layer 124, 2DEG conduction channel 40, and barrier layer 126 can generally form the active region of the HEMT device. It should be noted that while described herein primarily with reference to fabrication and structures of HEMT devices, the elements and concepts of embodiments described herein can be applied to many different types of transistor structures.

In some embodiments, the transistor device 100 includes a gallium-based semiconductor structure 190 that is formed on the substrate 122 (e.g., a silicon carbide substrate). As used herein, the term "gallium-based" refers to semiconducting compounds that include at least gallium, for example, GaN or GaAs. In some embodiments, the gallium-based semiconductor structure 190 may include, for example, a gallium nitride-based channel layer 124 (e.g., a GaN channel layer) and a gallium nitride based-barrier layer 126 (e.g., an AlGaN barrier layer) that is formed on the gallium nitride-based channel layer 124 opposite the substrate 122. Gallium nitride-based semiconductor structures 190 may include at least gallium and nitrogen, including gallium nitride (GaN) as well as ternary and quaternary compounds such as aluminum gallium nitride (AlGaN) and aluminum indium gallium nitride (AlInGaN).

A plurality of enhancement and/or depletion mode transistor devices 100 may be formed on and in the gallium-based semiconductor structure 190. The source and drain contacts 115 and 105 may be formed on the semiconductor structure 190, and the gate may be formed on the barrier layer 126 between the contacts 115 and 105. For example, the source and the drain contacts 115 and 105 may be formed as ohmic contacts (e.g., on implanted regions 215 and 205 in the channel layer 124) such that an electric current flows between the source and drain contacts 115 and 105 via the 2DEG channel region 40 induced at the heterointerface between the channel layer 124 and barrier layer 126 when the gate 110 is biased at an appropriate level.

In some devices, a portion 126B of the gallium-based barrier layer 126 that is between the source and drain contacts 115 and 105 may be at least partially etched to form a gate opening 126R (also referred to herein as the gate recess) in the barrier layer 126, and the gate 110 may be formed in the gate recess 126R. As such, the portion 126B of the barrier layer 126 under the gate 110 (i.e., extending between the gate 110 and the channel layer 124; also referred to as the gate region 126B) may have a thickness T2 that is less than a thickness T1 of portions 126A of the barrier layer 126 between the gate 110 and the source contact 115 or the drain contact 105. The region between the gate 110 and the source contact 115 (and the region between the gate 110 and the drain contact 105) may be referred to herein as access regions, or source/drain access regions 126A.

The gate recess 126R may extend partially through (e.g., in a depletion mode device) or completely through (e.g., in an enhancement mode device) the barrier layer 126. In a GaN HEMT including a GaN channel layer and an AlGaN barrier layer, conventional methods for recessing the barrier layer in enhancement mode and/or in depletion mode devices may use a single etch step to remove a portion of the AlGaN barrier layer to form the gate recess. This approach may have limited control over the etch depth, and/or may result in undesirable surface morphology effects on the barrier layer, including increased surface roughness, surface state changes, etc. Such surface morphology effects may cause variability in performance metrics, including but not limited to channel sheet resistance and threshold voltage, as well as potential reliability risks.

Some embodiments of the present invention may arise from realization that, as device integration increases, improved performance can be achieved by fabrication methods that allow more highly controlled removal of the barrier layer (e.g., a Ga-based material, including but not limited to GaN-based and GaAs-based materials) to form the gate recess, with limited or without substantial impact to the final surface states of the barrier layer. Some embodiments described herein may provide fabrication methods for forming (and transistor devices including) barrier layers that are thicker in the source/drain access regions 126A and/or thinner in the gate region 126B than some conventional devices. In particular, embodiments of the present invention include a looped recess process for improved control over the depth of the gate recess 126R, which may in some embodiments be comparable or equivalent to monolayer removal or atomic layer etching (ALE).

Benefits of maintaining the barrier layer thickness in the source and drain access regions 126A while selectively removing a portion of the barrier layer (e.g., in a depletion mode device) or an entirety of the barrier layer (in an enhancement mode device) in the gate region 126B to define the gate recess 126R may include (but are not limited to) maintaining sub-threshold gate control and increasing peak transconductance ($g_m$) without sacrificing on-state resistance ($R_{on}$), which may be advantageous for sub-100 nm gate length ($L_G$) technology development. In particular, as gate length $L_G$ is reduced without an increase in input voltage, a HEMT may be subject to short channel effects. In depletion mode devices, this may be alleviated by also reducing the thickness of the barrier layer in the channel region and/or increasing the thickness of the barrier layer in the source/drain access region; however, reducing the thickness of the barrier layer may negatively affect carrier concentration and conduction in the 2DEG channel region.

As such, by locally reducing the thickness T2 (see FIG. 1B) of the barrier layer in the gate region 126B (e.g., layer-by-layer, using a looped recess process as described herein), while maintaining or increasing the thickness T1 of the barrier layer 126 in the source/drain access regions 126A, embodiments of the present invention may allow for reduction of the gate length $L_G$ (for example, below 100 nm or below 90 nm), while maintaining on-resistance $R_{on}$ and sub-threshold gate control and increasing transconductance $g_m$. That is, embodiments of the present invention may provide performance benefits by increasing transconductance $g_m$ without sacrificing on-resistance. Some embodiments may achieve a peak transconductance $g_m$ of greater than about 400 mS/mm (e.g., about 450 mS/mm to 800 mS/mm, about 500 mS/mm to 600 mS/mm, or about 510 to 550 mS/mm), which may be at least 15% to 20% greater than that of some conventional HEMT devices.

Figure 1B:
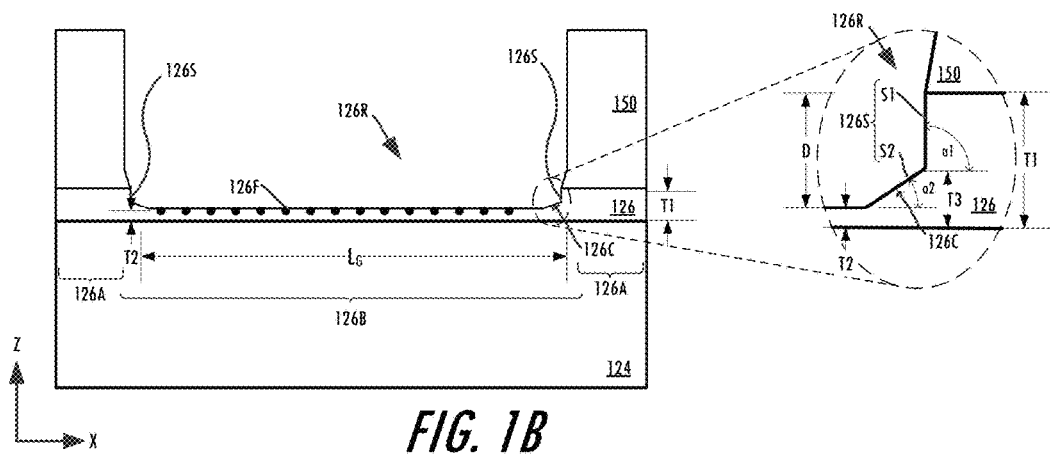
FIG. 1B is an enlarged cross-sectional view illustrating the gate recess of FIG. 1A.
Figure 1C:
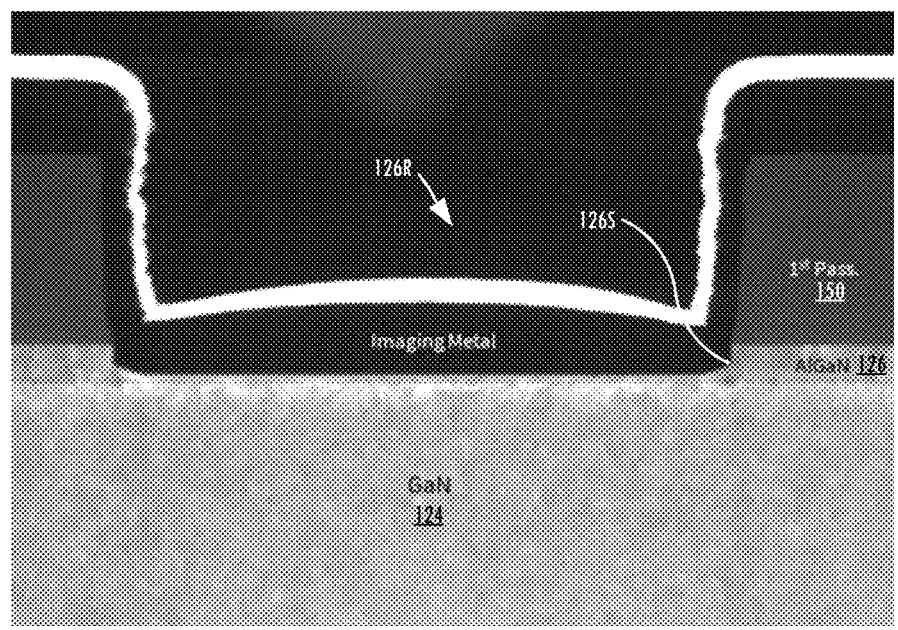
FIG. 1C is an electron microscope image of a cross-section of a gate recess of a transistor device according to some embodiments of the present invention.

FIG. 1B is an enlarged cross-sectional view of a section of the active area of the HEMT structure 100 of FIG. 1A illustrating the gate recess 126R. In particular, FIG. 1B illustrates the selective removal of a portion of the barrier layer 126 (e.g., using a looped recess process as described herein) in the gate region 126B to define the gate recess 126R. FIG. 1C is an electron microscope image of a cross-section of a gate recess of a transistor device according to some embodiments of the present invention.

As shown in FIGS. 1B and 1C, a first portion 126A of the barrier layer 126 between the source 115 or drain contact 105 and the gate 110 (i.e., in the source/drain access region 126A) has a thickness T1, and a second portion 126B of the barrier layer between the gate 110 and the channel layer 124 (i.e., along a floor 126F of the gate recess 126R) has a thickness T2. In some embodiments, the thickness T1 of the barrier layer 126 in the source/drain access region 126A may be greater than about 150 Angstroms (Å) (e.g., about 150 Å to 350 Å, or about 200 Å to 250 Å), while the thickness T2 of the barrier layer 126 under the gate 110 may be less than about 150 Å (e.g., about 30 Å to 150 Å, or about 50 Å to 100 Å). The first thickness T1 of the source/drain access portion 126A of the barrier layer 126 may be greater than the second thickness T2 of the gate recess portion 126B by about 250 Å or less or about 150 Å or less, for example, by about 100 Å.

The looped recess process as described herein may allow for controlled, layer-by-layer removal of the portion 126B of the barrier layer 126 to form the gate recess 126R to a desired depth D (as measured from a surface of the barrier layer 126 opposite the channel layer 124), in some embodiments independent of the thickness of the barrier layer 126 in the source/drain access region 126A, and with limited effect on the surface states of the etched portion 126B of the barrier layer 126. For example, the floor 126F of the gate recess 126R may have a surface roughness of less than about 3 Å, for example, about 1 Å to 2 Å, e.g., about 1.5 Å, when formed in accordance with embodiments described herein. The surface roughness of less than about 3 Å may be present on one or more or all of the recessed surfaces, including the floor 126F, the corners 126C, and the sidewalls 126S of the gate recess 126R. The surface roughness may refer to a root mean square (RMS) surface roughness (Rq) or an average surface roughness (Ra) per unit area of the floor 126F. In some embodiments, the edges or corner portions 126C of the gate recess 126R (which may include inclined surfaces in some embodiments) may have a similar or same surface roughness as the substantially planar portions of the floor 126F therebetween. That is, the gate recess 126R may have the desired surface roughness from sidewall 126S to sidewall 126S, along an entirety of the portion 126B of the barrier layer 126 between the sidewalls 126S (including the floor 126F and the edges 126C). In some embodiments, the edges 126C of the gate recess 126R may be coplanar with the substantially planar portions of the floor 126F extending therebetween (such that the gate recess 126R includes a substantially planar surface extending from sidewall 126S to sidewall 126S), while in other embodiments, the edges 126C may be inclined or sloped relative to the substantially planar portions of the floor 126F, as described greater detail below.

In some embodiments, the depth D of the gate recess 126R may be less than 250 Å, for example, about 50 Å to 150 Å, e.g., about 100 Å. That is, the depth D of the gate recess 126R may be precisely controlled such that the first thickness T1 of the source/drain access portion 126A of the barrier layer 126 may be about 1.5 times to about 4 times greater the second thickness T2 of the gate recess portion 126B (e.g., T1 may be about 2 times thicker or about 3 times thicker than T2). In some embodiments, the relative thickness T2 of the gate recess portion 126B may be expressed as a percentage of the thickness T1 of the source/drain access portion 126A. For example, T2 may be about 25% to 66% of T1.

In some embodiments, the length of the gate 110 along the floor 126F of the gate recess 126R (referred to herein as the gate length $L_G$) may be less than about 100 nanometers (nm). For example, the gate length $L_G$ may be about 90 nm (or less), about 70 nm (or less), about 60 nm (or less), or about 50 nm (or less). Looped recess processes in accordance with some embodiments of the present invention may be used to precisely scale the thickness T2 of the portion 126B of the barrier layer 126 in the gate recess 126R with the gate length $L_G$, such that a desired ratio of the gate length $L_G$ to the barrier layer thickness T2 in the gate recess 126R may be maintained with decreasing gate length.

Controlling the relative thicknesses T1 and T2 of the barrier layer 126 (as well as the ratio of the barrier layer thickness T2 relative to the gate length $L_G$) in the ranges described herein may be critical to achieving some of the improved electrical performance characteristics described herein. For example, providing the thicknesses T1 and T2 within the ranges described herein and/or maintaining a desired ratio of the gate length $L_G$ to the barrier layer thickness T2 in the gate recess 126R can maintain sub-threshold control with decreasing gate length $L_G$, and thus, may contribute to increased peak transconductance $g_{m\ max}$. In some embodiments, for a gate length $L_G$ of about 150 nm, the barrier layer 126 may be recessed to a thickness T2 of about 150 Å (15 nm) at the floor 126F of the gate recess 126R. As another example, for a gate length $L_G$ of about 90 nm, the barrier layer 126 may be recessed to a thickness T2 of about 90 Å (9 nm) at the floor 126F of the gate recess 126R. In another example, for a gate length $L_G$ of less than nm, the barrier layer 126 may be recessed to a thickness T2 of less than 90 Å (9 nm) at the floor 126F of the gate recess 126R.

That is, embodiments of the present invention may provide or maintain a ratio of gate length $L_G$ (in nm) to recessed barrier layer thickness T2 (in Å) of about 10:1 or less, i.e., such that the recessed barrier layer thickness T2 is about one tenth of the gate length $L_G$ (or less). In contrast, some conventional transistor devices with a gate length of about 350 nm may have a barrier layer thickness of about 250 Å (25 nm) in the gate recess (or a gate length of about 250 nm and a barrier layer thickness of about 180 Å (18 nm) in the gate recess), that is, with a ratio of gate length to barrier layer thickness of about 13:1 or 14:1 or more.

Some embodiments of the present invention may provide transistor devices 100 with a peak transconductance $g_m$ of greater than about 400 mS/mm, for example, about 450 mS/mm to 800 mS/mm, about 500 mS/mm to 600 mS/mm, or about 510 to 550 mS/mm (as compared to a $g_m$ of up to about 400 mS/mm for some conventional devices) and an on-resistance $R_{on}$ of about 1.5 Ω-mm to 3 Ω-mm, for example, about 1.6 Ω-mm, with a cut-off frequency ($f_T$) of about 15 to 40 GHz. Some conventional transistor devices may thus exhibit a significantly lower peak transconductance $g_m$ than transistor devices having the barrier layer thicknesses T1, T2, and/or gate length-to-barrier layer thickness ratios $L_G$:T2 described herein.

In addition, the looped recess process as described herein may include one or more parameters that can be controlled to provide the sidewalls 126S of the gate recess 126R with one or more desired profiles or slope angles. In particular, when formed using a looped recess process according to some embodiments of the present invention, the gate recess 126R in the barrier layer 126 may include opposing sidewalls 126S defining one or more angles of about 45 degrees to about 90 degrees relative to (or relative to a plane parallel to) the floor 126F extending between the sidewalls 126S. For example, the sidewall 126S may include a first portion S1 having a slope or angle a1 of about 90 degrees (e.g., about 85 degrees to about 95 degrees, with greater controllability and less dependence on crystal structure than a conventional gate etch process) and a second portion S2 having a slope or angle a2 of about 45 degrees (e.g., about 40 degrees to about 50 degrees). The angle a2 of the sidewall portion S2 may thus define an intermediate thickness (between T1 and T2) such that the barrier layer 126 has a thickness T3 at the edge or corner portions 126C (between the sidewall S1 and the floor 126F) of the gate recess 126R that is greater than the thickness T2 at the substantially planar floor 126F therebetween.

That is, a thickness T3 at edges 126C of the gate recess 126R may be greater than a thickness T2 at substantially planar portions of the floor 126F therebetween. The sidewall portion S2 at the angle a2 (defining the intermediate thickness T3) may define an inclined surface that provides a more gradual transition between the floor 126F and the more vertical sidewall portion S1 of the gate recess 126R, which may improve carrier mobility and/or provide a less abrupt change in electric field distribution (or 2DEG charge density) in the barrier layer 126 in comparison to a gate recess formed by some conventional gate etch processes (e.g., which may provide sharper corners between the floor and sidewalls thereof). As such, the sidewall profile S1, S2 may reduce peak electric field concentration at corners 126C of the gate recess 126R, which may improve device reliability, for example, with respect to electric field breakdown. However, it will be understood that the inclined surfaces at the edges 126C may not be present in some embodiments (i.e., the angle a2 of portion S2 may be zero), such that the substantially planar floor 126F may continuously extend between the opposing sidewall portions S1 with a substantially uniform thickness T2 (i.e., T2 may be equal to T3). Also, while illustrated with reference to a surface or portion S2 inclined at a single angle a2 by way of example, in some embodiments the surface S2 may include multiple inclined surfaces, each inclined at a respective angle between zero degrees and the angle a1 of the sidewall portion S1 (inclusive), or may include a surface with a curvature between the surface of the floor 126F and the sidewall portion S1. In embodiments where the angle a2 is zero degrees, the sidewall S1 may effectively continuously extend to the floor 126F (i.e., the substantially vertical sidewall portion S1 may intersect the substantially horizontal floor 126F).

As shown in the image of FIG. 1C, the transistor device 100 includes a gate recess 126R in an AlGaN barrier 126, with sidewalls 126S having the etch profile angles a1, a2 and thicknesses T1, T2, T3 shown in FIG. 1B. While illustrated with reference to two sidewall portions S1 and S2, it will be understood that the sidewalls 126S of the gate recess 126R may include fewer or more portions by varying one or more parameters the looped recess process as described herein.

Figure 3:
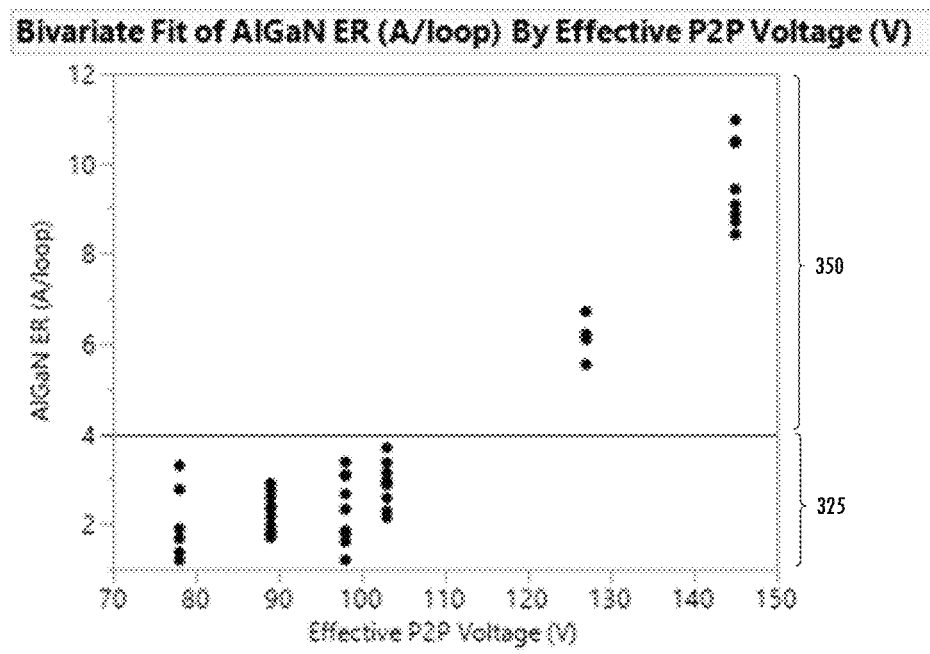
FIG. 3 is a graph illustrating example parameters for a looped recess process according to some embodiments of the present invention.
Figure 2A:
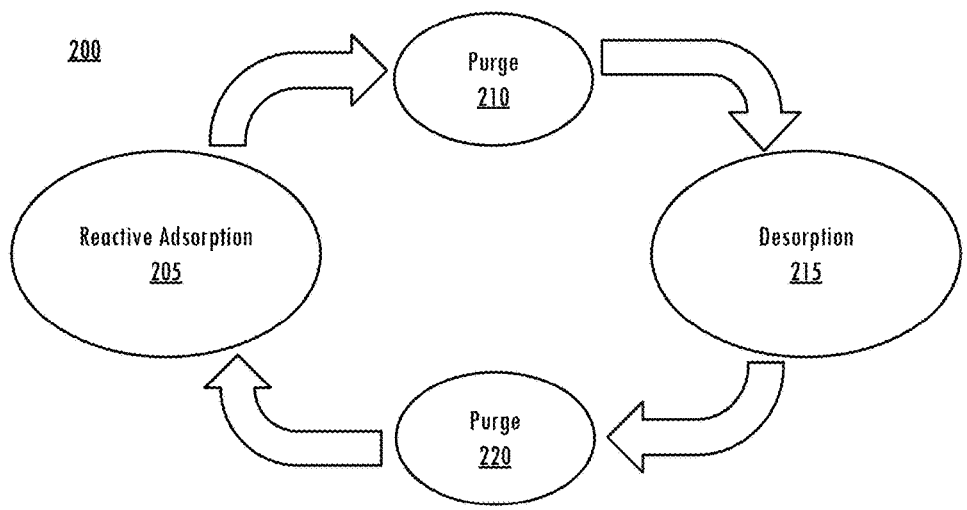
FIGS. 2A and 2B are schematic diagrams illustrating methods of forming a gate recess for a transistor device using a looped recess process according to some embodiments of the present invention.
Figure 2B:
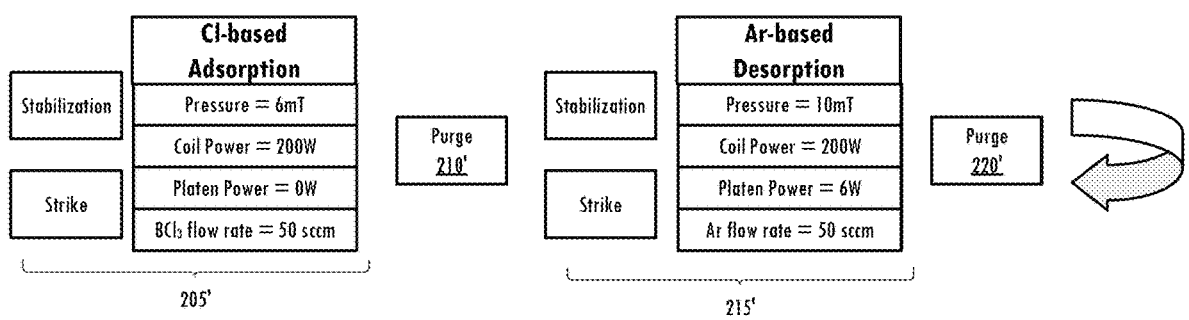

FIGS. 2A and 2B are schematic diagrams illustrating methods of forming a gate recess for a transistor device using a looped recess process according to some embodiments of the present invention. FIG. 3 is a graph illustrating example parameters for a looped recess process according to some embodiments of the present invention.

As shown in FIGS. 2A and 2B, embodiments of the present invention provide a looped recess process 200, 200' that allows for layer-by-layer removal of a portion of a barrier layer 126 to define a gate recess 126R as described herein. The looped recess process 200, 200' may be a plasma etch process, where each of the loops is configured to remove a monolayer of the barrier layer 126. A monolayer as described herein may have a thickness of about 5 Angstroms (Å) or less, for example, about 0.1 Å to 5 Å, or about 0.25 Å to 4 Å. The monolayer thickness may correspond to the lattice constant of the material being recessed. For example, for an AlGaN barrier layer, the monolayer thickness may be about 3.186 Å.

FIG. 2A illustrates that each loop of the plasma etch process 200 includes a reactive (e.g., chlorine (Cl)-based) adsorption operation 205 and a low power (e.g., argon (Ar)-based) desorption operation 215, with purge operations 210, 220 (e.g., helium (He)- or nitrogen (N)-based) therebetween. The operations 205, 210, 215, and 220 may be repeated or "looped" to provide layer-by-layer removal of the barrier layer 126 until a desired depth D of the gate recess 126R is achieved.

FIG. 2B illustrates example parameters for a plasma etch process 200' in greater detail. In the operations of FIG. 2B, a Ga-based semiconductor wafer (e.g., the substrate 122 including a GaN channel layer 124 and an AlGaN barrier layer 126) may be mounted on a chuck provided inside a chamber of an inductively coupled plasma (ICP) etching apparatus. The chamber may include a platen and may be surrounded by a coil. Power applied to the coil may generate plasma from a gas introduced into the chamber, while power applied to the platen may affect ion flux and speed at which the ions are accelerated toward the surface to be etched (e.g., the exposed surface of the AlGaN barrier layer 126).

In particular, in operation 205', a reactant gas (e.g., Cl) is introduced into the chamber (e.g., at a pressure of about 6 mT), for example, with a flow rate of about 50 sccm. High frequency (RF) power (e.g., at about 200 W) is applied to a coil of the ICP etching apparatus, which induces an electromagnetic current that acts on the reactant gas to generate a plasma for the adsorption process. For example, operation 205' may include chlorinating the surface of AlGaN barrier layer (e.g., with a Cl-based gas, such as $Cl_2$ or boron trichloride ($BCl_3$)). The chlorinating may be performed using coil power only (i.e., without ion driving/platen power), which may promote primarily chemical reactive adsorption of Cl on the exposed Ga-based surface. In operation 210', a purge process is performed by introducing a purge gas (e.g., He or N) into the chamber to evacuate the reactant gas.

In operation 215', an etchant gas (e.g., Ar) is introduced into the chamber (e.g., at a pressure of about 10 mT), for example, with a flow rate of about 50 sccm. High frequency (RF) power (e.g., at about 200 W) is applied to a coil of the ICP etching apparatus to induce an electromagnetic current that acts on the etchant gas to generate a plasma for the desorption process. For example, operation 215' may include an argon-based ion milling operation that results in the desorption of the volatile etch by-product. The Ar-based ion milling may be performed at a relatively low platen power (for example, about 4 W to 10 W, e.g., 6 W), with a controlled peak-to-peak voltage so as to produce substantially uniform incident ion energy. The peak-to-peak voltage may refer to the magnitude of the RF voltage at the surface of the platen.

In operation 220', another purge process is performed by introducing a purge gas (e.g., He or N) into the chamber to evacuate the etchant gas. The operations 205', 210', 215', and 220' are looped until the desired recess depth in the Ga-based barrier layer is achieved by the looped recess process 200'.

In some embodiments, one or more parameters of the looped recess process 200, 200' may be defined to ensure monolayer removal, e.g., to account for ICP tool variation. FIG. 3 illustrates variation in etch rate (in A per loop) with peak-to-peak voltage in the looped recess process 200, 200'. As shown in the graph of FIG. 3, the plasma etch process is performed using an ICP tool and a peak-to-peak voltage of less than about 120V, for example, about 70V to about 110V. This peak-to-peak voltage range results in an etch rate of less than about 5 Å per loop, effectively providing atomic layer etching 325 (i.e., monolayer removal). In contrast, at peak-to-peak voltages of greater than 120V, etching rate may be greater than about 5 Å per loop, which may be similar or equivalent to a sputter etch regime or process 350.

FIGS. 2A, 2B and 3 are described herein with reference to methods of removing portions of an AlGaN barrier layer using a looped plasma process to effectively achieve atomic layer etching using an ICP tool, but it will be understood that embodiments of the present invention are not limited to the particular materials and/or tools described herein, and may be similarly applied to other materials and/or tools. For example, layer-by-layer removal of other Ga-based layers (e.g., an AlGaAs layer) may be performed using a looped Cl adsorption and Ar desorption process and parameters as shown in FIGS. 2A, 2B and 3.

The looped recess process 200, 200' described herein can thus be used in HEMT device fabrication to selectively etch the gate recess 126R in the barrier layer 126 in both enhancement mode and depletion mode devices, with greater control of the gate recess depth D and improved surface characteristics at the floor 126F of the gate recess 126R than some conventional plasma-based etching. For example, in some embodiments, the looped recess process 200, 200' may provide a surface roughness of less than about 3 Å (e.g., about 1 Å to 2 Å) along the floor 126F of the gate recess 126R.

The looped recess process 200, 200' may also allow for etching of the gate recess 126R in the barrier layer 126 with a higher degree of directionality than some conventional plasma-based etching. For example, as discussed above with reference to FIG. 1B, the gate recess 126R may have sidewalls 126S with a slope S1, S2 of about 90 degrees, or about 45 degrees to 90 degrees. In some embodiments, the sidewalls 126S of the gate recess 126R may include a lower portion S2 with a slope of about 45 degrees adjacent the floor 126F of the gate recess 126R, and an upper portion S1 with a slope of about 90 degrees. More generally, one or more parameters of the looped recess process 200, 200' may be varied to provide a desired sidewall slope 126S of up to about 90 degrees.

FIGS. 4A-4D, 5A-5D, and 6A-6D are schematic cross-sectional views illustrating methods of forming a gate recess 126R for a transistor device 100 using looped recess processes according to various embodiments of the present invention. In some embodiments, the operations of FIGS. 4A-4D, 5A-5D, and 6A-6D may be implemented after fabrication of the source and drain ohmic contacts 115 and 105, to avoid damaging the gate 110 in the high temperature ohmic process.

Figure 4A:
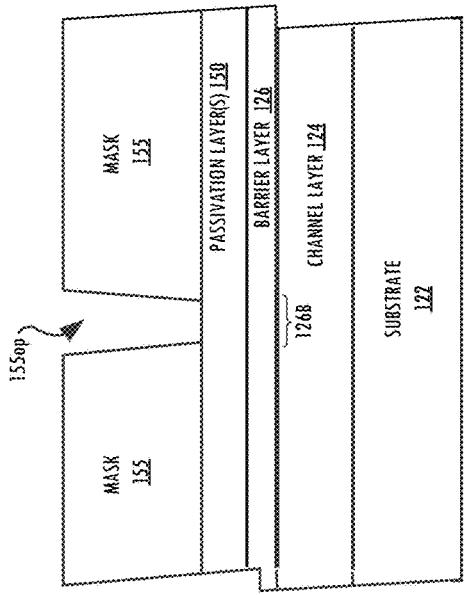
FIGS. 4A, 4B, 4C, and 4D are schematic cross-sectional views illustrating methods of forming a gate recess for a transistor device using a looped recess process according to some embodiments of the present invention.
Figure 4B:
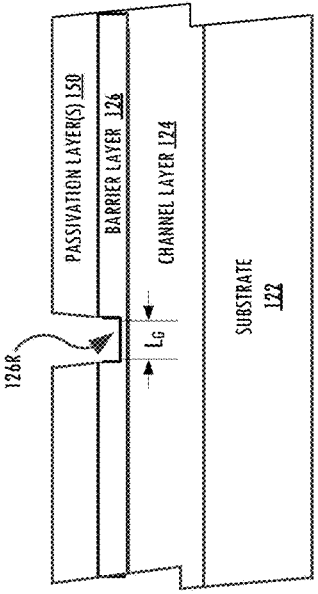
Figure 4C:
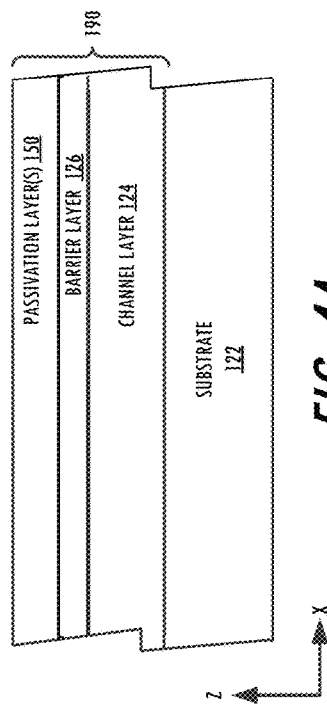
Figure 4D:
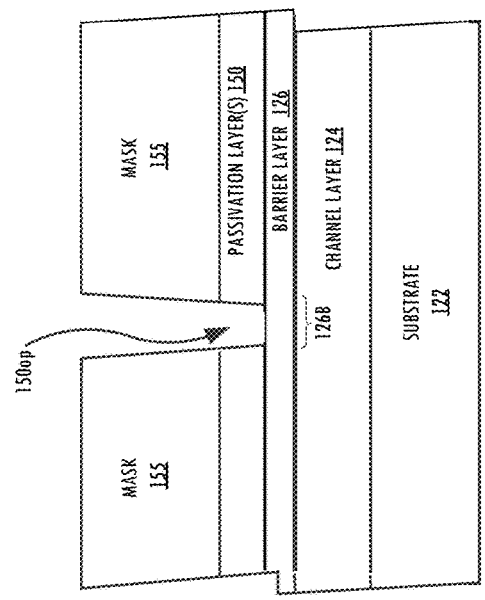

FIGS. 4A-4D illustrate methods of forming a gate recess using a looped recess process according to some embodiments. As shown in FIG. 4A, one or more passivation layer(s) 150 are formed on the semiconductor structure 190 including the channel layer 124 and the barrier layer 126. In FIG. 4B, an etch mask 155 (e.g., a patterned photoresist mask) is formed on the passivation layer(s) 150. The etch mask 155 includes an opening 155op therein (e.g., as formed by electron beam lithography on the photoresist material). As shown in FIG. 4C, the passivation layer(s) 150 are etched using the mask 155 to expose a surface of the barrier layer 126 in the gate region 126B, thereby forming an initial opening or recess 150op. The surface of the barrier layer 126 exposed by the initial opening 150op may define the desired gate length $L_G$. The looped recess process 200, 200' is then performed to remove, layer-by-layer, the portion of the barrier layer 126 in the gate region 126B exposed by the initial opening 150op to form the gate recess 126R, as shown in FIG. 4D. The gate recess 126R may include one or more of the characteristics (e.g., surface roughness, sidewall slope(s) a1, a2, relative thicknesses T1, T2, T3, gate length-to-recessed barrier layer thickness ratios $L_G$:T2, transconductance $g_m$, on-resistance $R_{on}$) described herein.

That is, prior to performing the looped recess process 200, 200' to define the gate recess 126R with the desired characteristics, a passivation layer 150 is formed on the semiconductor structure 190, and an opening 150op is formed in the passivation layer 150 to expose a surface of the barrier layer 126. In the example of FIGS. 4A-4D, the source and drain contacts 115 and 105 and the source/drain access regions 126A are protected (e.g., by the etch mask 155) during the looped plasma etch process 200, 200'.

Figure 5A:
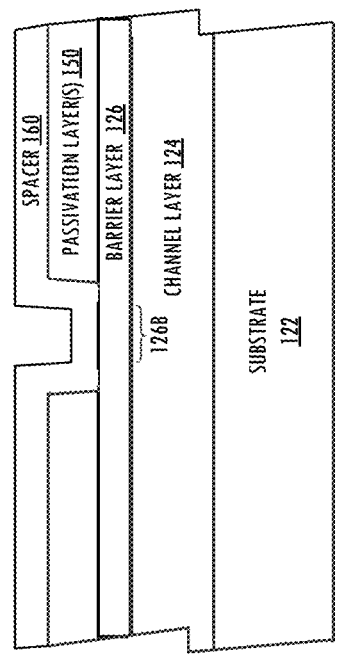
FIGS. 5A, 5B, 5C, and 5D are schematic cross-sectional views illustrating methods of forming a gate recess for a transistor device using a looped recess process according to further embodiments of the present invention.
Figure 5B:
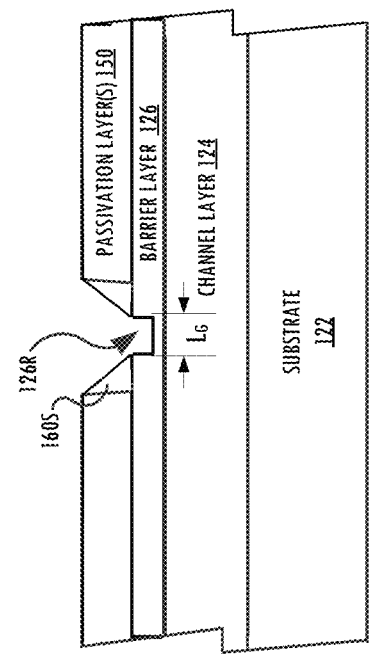
Figure 5C:
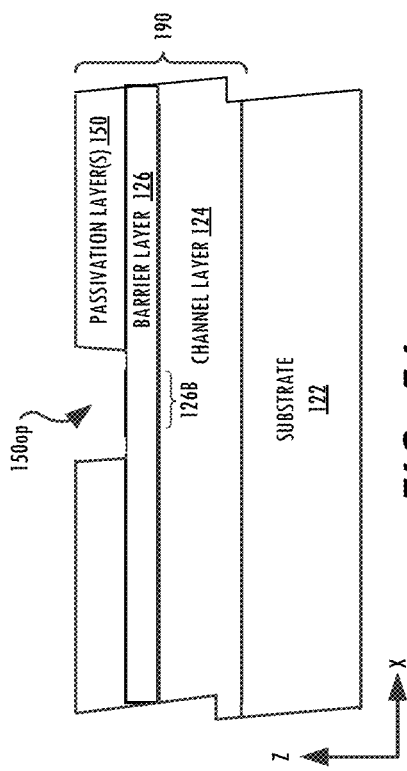
Figure 5D:
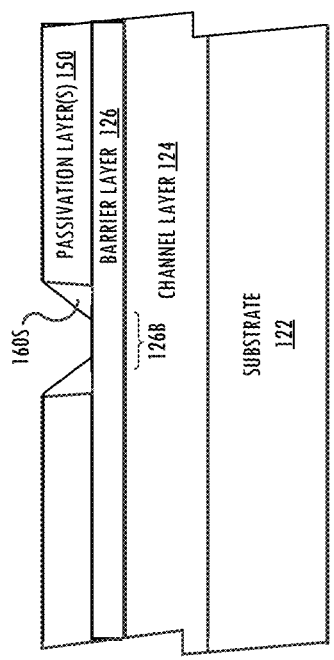

FIGS. 5A-5D illustrate methods of forming a gate recess using a looped recess process according to further embodiments. As shown in FIG. 5A, one or more passivation layer(s) 150 are formed on the semiconductor structure 190 including the channel layer 124 and the barrier layer 126, and the passivation layer(s) 150 are patterned to define an opening 150op therein in the gate region 126B. In FIG. 5B, a spacer layer 160 is formed on the surface of the passivation layer(s) 150 and in the opening 150op. As shown in FIG. 5C, the spacer layer 160 is patterned to form spacers 160S on opposing sidewalls of the passivation layer(s) 150 and to expose a surface of the barrier layer 126 in the gate region 126B. The surface of the barrier layer 126 exposed by the spacers 160S may define the desired gate length $L_G$. The looped recess process 200, 200' is then performed to remove, layer-by-layer, the portion of the barrier layer 126 in the gate region 126B exposed by the spacers 160S to form the gate recess 126R, as shown in FIG. 5D. The gate recess 126R may include one or more of the characteristics described herein.

That is, prior to performing the looped recess process 200, 200' to define the gate recess 126R with the desired characteristics, a passivation layer 150 is formed on the semiconductor structure 190, an opening 150op is formed in the passivation layer 150 to expose a surface of the barrier layer 126, and spacers 160S are defined on opposing sidewalls of the opening 150op to define the desired gate length $L_G$. In the example of FIGS. 5A-5D, the source and drain contacts 115 and 105 and the source/drain access regions 126A may be protected (e.g., by portions of the spacer layer 160) during the looped plasma etch process 200, 200'.

Figure 6A:
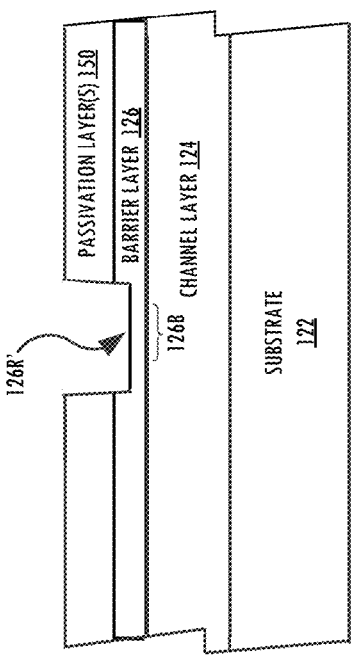
FIGS. 6A, 6B, 6C, and 6D are schematic cross-sectional views illustrating methods of forming a gate recess for a transistor device using a looped recess process according to yet further embodiments of the present invention.
Figure 6B:
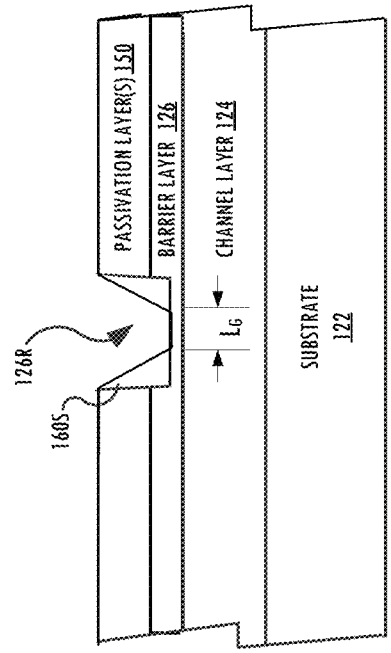
Figure 6C:
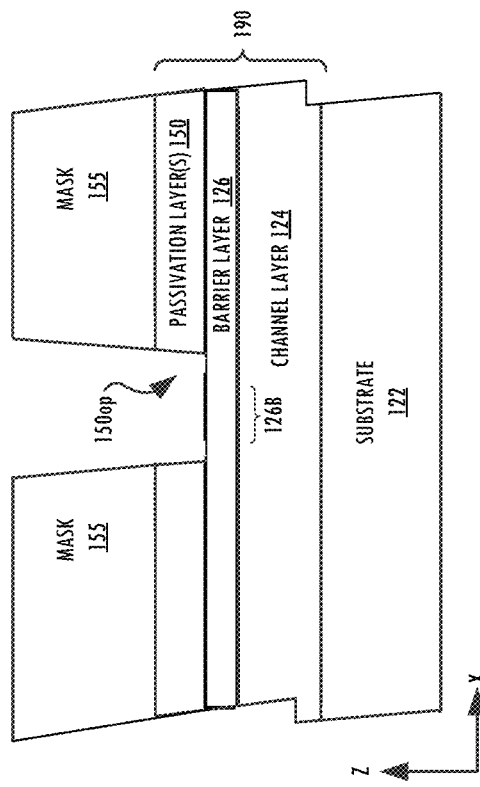
Figure 6D:
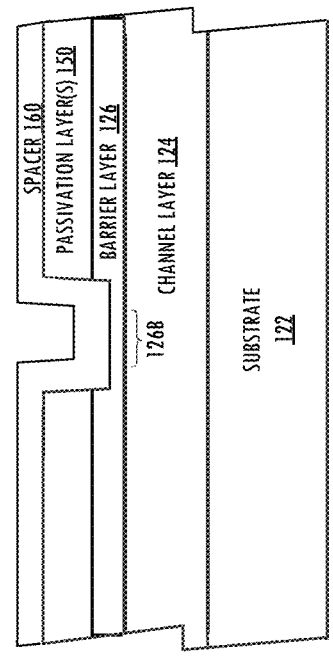

FIGS. 6A-6D illustrate methods of forming a gate recess using a looped recess process according to yet further embodiments. As shown in FIG. 6A, one or more passivation layer(s) 150 are formed on the semiconductor structure 190 including the channel layer 124 and the barrier layer 126, and the passivation layer(s) 150 are patterned (e.g., using a mask 155) to define an opening 150op therein exposing a surface of the barrier layer 126 in the gate region 126B. In FIG. 6B, the looped recess process 200, 200' is performed to remove, layer-by-layer, the portion of the barrier layer 126 in the gate region 126B exposed by the opening 150op to define an initial gate recess 126R'. The initial gate recess 126R' may include one or more of characteristics of the gate recess 126R described herein. In FIG. 6C, a spacer layer 160 is formed on the surface of the passivation layer(s) and in the initial gate recess 126R'. As shown in FIG. 6D, the spacer layer 160 is patterned to form spacers 160S on opposing sidewalls of the passivation layer(s) 150 and to expose a surface of the barrier layer 126 in the gate region 126B, defining the gate recess 126R. The surface of the barrier layer 126 exposed by the spacers 160S may define the desired gate length $L_G$.

That is, a passivation layer 150 is formed on the semiconductor structure 190 and an opening is formed in the passivation layer 150 to expose a surface of the barrier layer 126 prior to performing the looped recess process 200, 200' to define the gate recess 126R' with the desired characteristics, while the spacers 160S are formed on opposing sidewalls of the passivation layer 150 and the gate recess 126R' after performing the looped recess process 200, 200'. In the example of FIGS. 6A-6D, the source and drain contacts 115 and 105 and the source/drain access regions 126A may be protected (e.g., by the etch mask 155) during the looped plasma etch process 200, 200'.

Embodiments of the present invention including a gate recess 126R with characteristics as described herein may provide improved performance, for instance, in RF and power switching devices. For example, embodiments of the present invention may be used in applications with operating frequencies that range from less than about 4 GHz to Ka-Band designs (e.g., 26-40 GHz).

Figure 7:
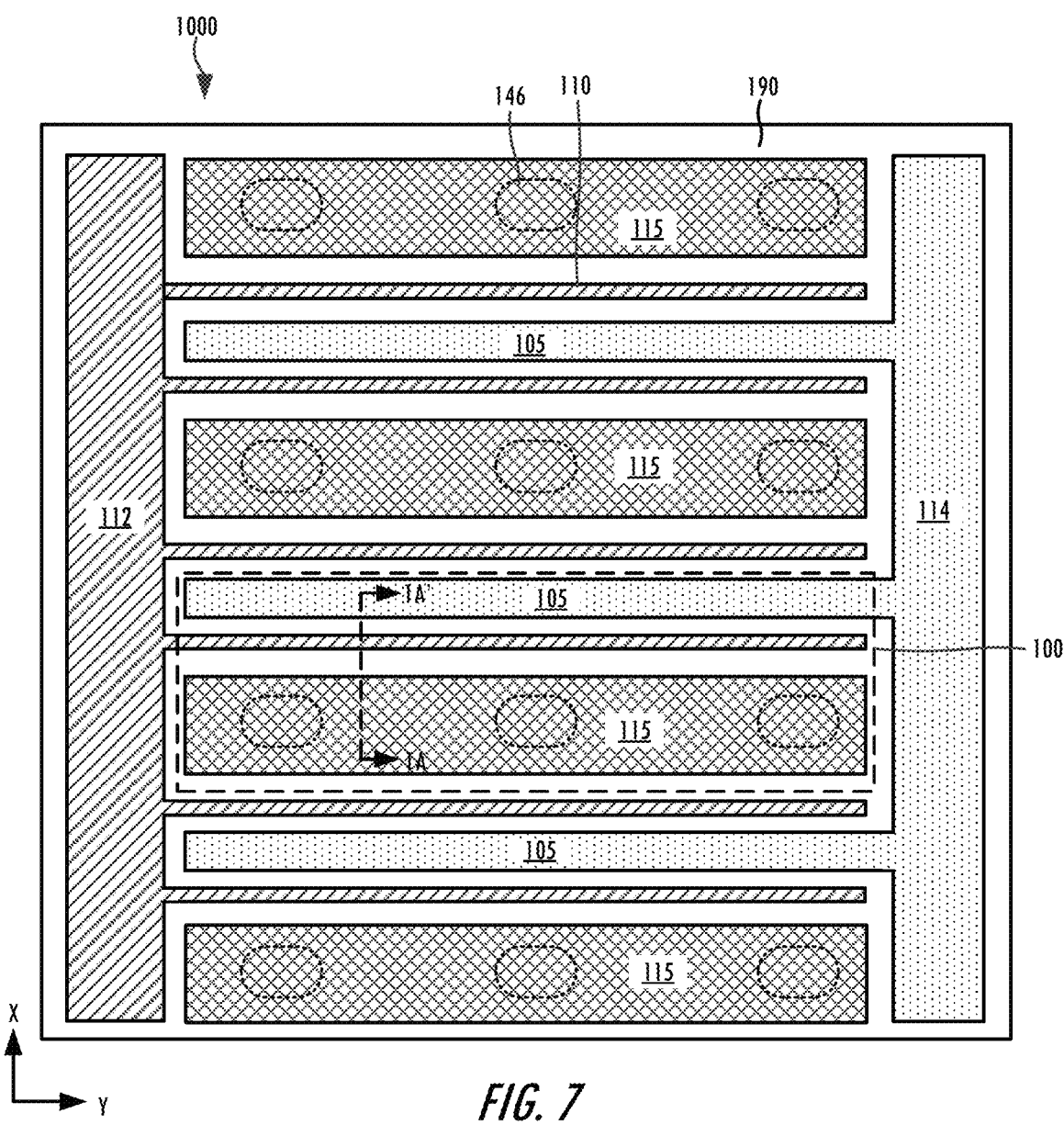
FIG. 7 is a schematic plan view of a Group III nitride-based transistor die according to embodiments of the present invention that illustrates metallization on a surface of the semiconductor structure thereof.

FIG. 7 is a schematic plan view of a Group III nitride-based transistor die according to embodiments of the present invention that illustrates metallization on a surface of the semiconductor structure thereof. As shown in FIG. 7, a transistor device or die 1000 may include multiple transistor structures 100 connected in parallel to device terminals or electrodes (e.g., an input terminal, an output terminal, and a ground terminal). For example, each of the gate 110, drain 105, and source 115 contacts may extend in a first direction (e.g., the Y-direction) to define gate, drain, and/or source 'fingers', which may be connected by one or more respective buses (e.g., by a gate bus and a drain bus on an upper surface of the semiconductor structure 190.

In FIG. 7, the gate fingers 110, drain fingers 105 and source fingers 115 may extend in parallel to each other, with the gate fingers 110 extending from the gate bus 112 in a first direction and the drain fingers 105 extending from the drain bus 114 in a direction opposite the first direction. Each gate finger 110 may be positioned between a drain finger 105 and a source finger 115 to define a unit cell 100. The gate fingers 110, drain fingers 105, and source fingers 315 (and connecting buses) may define part of gate-, drain-, and source-connected electrodes of the device, respectively, as defined by a top or frontside metallization structure. Dielectric layers that isolate the various conductive elements of the frontside metallization structure from each other are not shown in FIG. 7 to simplify the drawing. Since the gate fingers 110 are electrically connected to a common gate bus 112, the drain fingers 105 are electrically connected to a common drain bus 114, and the source fingers 115 are electrically connected together (e.g., through respective via openings 146), it can be seen that the unit cell transistors 100 are electrically connected together in parallel.

One of the terminals of the device (e.g., a source terminal connected to the source contact(s) 115) may be configured to be coupled to a reference signal such as, for example, an electrical ground. In some embodiments, a conductive through substrate via connection or structure (e.g., a backside via opening) may extend through the substrate 122 and epitaxial layer(s) 124, 126 to expose a portion of one of the contacts 105, 115, so as to allow for contact pads or terminals on the back side of the substrate (e.g., to couple the source contact 115 to ground). In other embodiments, a ground connection to one of the terminals device (e.g., the source terminal) may be provided outside the active area, e.g., in a peripheral area. In some embodiments, a backmetal layer on the back side of the substrate 122 may provide a backside ground plane, for example, in applications where proximity to ground may be desired.

While embodiments of the present invention have been described herein with reference to particular HEMT structures, the present invention should not be construed as limited to such structures, and may be applied to formation of many different transistor structures, such as pHEMTs (including GaAs/AlGaAs pHEMTs) and/or GaN MESFETs. Also, additional layers may be included in transistor structures while still benefiting from the teachings of the present invention. Such additional layers may include GaN cap layers, as described for example U.S. Pat. No. 6,548,333 to Smith. In some embodiments, insulating layers such as SiNx, or relatively high quality AlN may be deposited for making a MISHEMT and/or passivating the surface. The additional layers may also include a compositionally graded transition layer or layers. In addition, the barrier layer 126 and/or channel layer 124 described above may include multiple layers. Thus, embodiments of the present invention should not be construed as limiting these layers to a single layer but may include, for example, barrier layers having combinations of GaN, AlGaN and/or AlN layers.

Figure 8A:
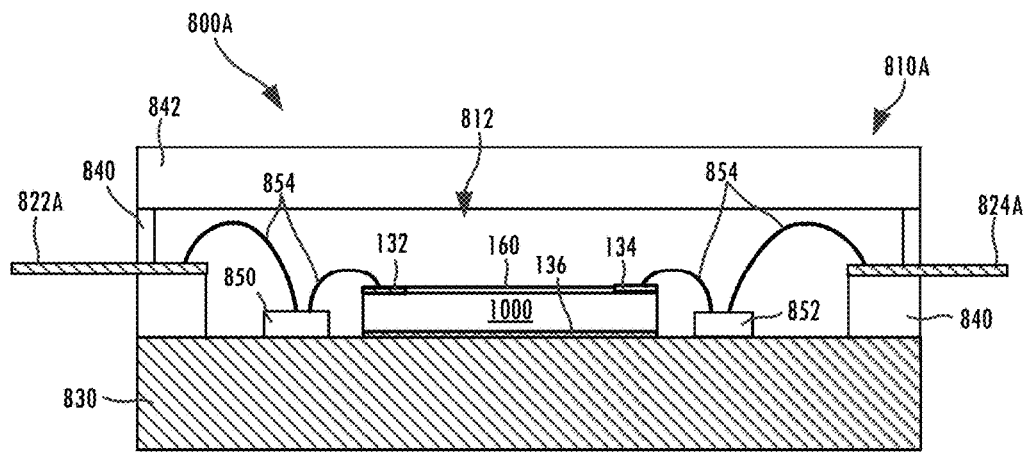
FIGS. 8A, 8B, and 8C are schematic cross-sectional views illustrating example packages including transistor devices according to embodiments of the present invention to provide packaged transistor amplifiers.
Figure 8B:
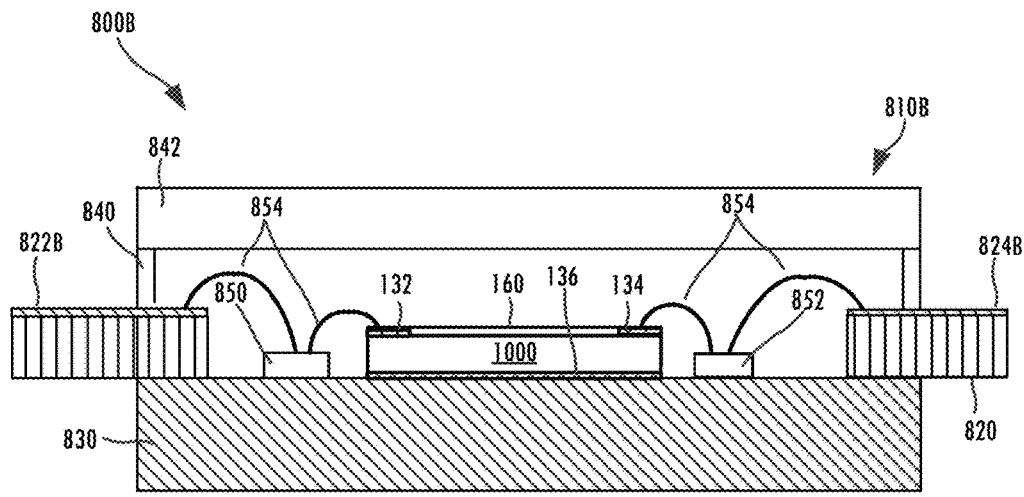
Figure 8C:
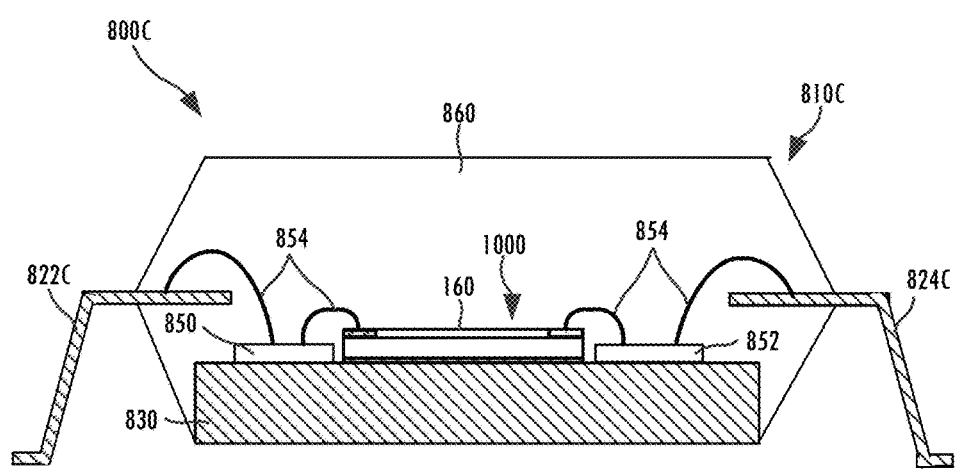

FIGS. 8A, 8B, and 8C are schematic cross-sectional views illustrating several example ways that that the RF transistor amplifier dies according to embodiments of the present invention may be packaged to provide packaged RF transistor amplifiers 800A, 800B, 800C. FIGS. 8A-8C show packaging of the transistor device 1000, which may include any of the transistor structures described herein.

FIG. 8A is a schematic side view of a packaged Group III nitride-based RF transistor amplifier 800A. As shown in FIG. 8A, packaged RF transistor amplifier 800A includes the RF transistor amplifier die 1000 packaged in an open cavity package structure 810A. The package structure 810A includes metal gate leads 822A, metal drain leads 824A, a metal submount 830, sidewalls 840 and a lid 842.

The submount 830 may include materials configured to assist with the thermal management of the package 800A. For example, the submount 830 may include copper and/or molybdenum. In some embodiments, the submount 830 may be composed of multiple layers and/or contain vias/interconnects. In an example embodiment, the submount 830 may be a multilayer copper/molybdenum/copper metal flange that comprises a core molybdenum layer with copper cladding layers on either major surface thereof. In some embodiments, the submount 830 may include a metal heat sink that is part of a lead frame or metal slug. The sidewalls 840 and/or lid 842 may be formed of or include an insulating material in some embodiments. For example, the sidewalls 840 and/or lid 842 may be formed of or include ceramic materials. In some embodiments, the sidewalls 840 and/or lid 842 may be formed of, for example, $Al_2O_3$. The lid 842 may be glued to the sidewalls 840 using an epoxy glue. The sidewalls 840 may be attached to the submount 830 via, for example, brazing. The gate lead 822A and the drain lead 824A may be configured to extend through the sidewalls 842, though embodiments of the present invention are not limited thereto.

The RF transistor amplifier die 1000 is mounted on the upper surface of the metal submount 830 in an air-filled cavity 812 defined by the metal submount 830, the ceramic sidewalls 840 and the ceramic lid 842. Gate and drain terminals 132, 134 of RF transistor amplifier die 1000 are on the top side of the semiconductor structure 190, while the source terminal 136 is on the bottom side of the semiconductor structure 190. The source terminal 136 may be mounted on the metal submount 830 using, for example, a conductive die attach material (not shown). The metal submount 830 may provide the electrical connection to the source terminal 136 and may also serve as a heat dissipation structure that dissipates heat that is generated in the RF transistor amplifier die 1000.

Input matching circuits 850 and/or output matching circuits 852 may also be mounted within the package 800A. The matching circuits 850, 252 may include impedance matching and/or harmonic termination circuits. The impedance matching circuits may be used to match the impedance of the fundamental component of RF signals that are input to or output from the RF transistor amplifier to the impedance at the input or output of the RF transistor amplifier die 1000, respectively. The harmonic termination circuits may be used to ground harmonics of the fundamental RF signal that may be present at the input or output of the RF transistor amplifier die 1000. More than one input matching circuit 850 and/or output matching circuit 852 may be provided. As schematically shown in FIG. 8A, the input and output matching circuits 850, 852 may be mounted on the metal submount 830. The gate lead 822A may be connected to the input matching circuit 850 by one or more bond wires 854, and the input matching circuit 850 may be connected to the gate terminal 132 of RF transistor amplifier die 1000 by one or more additional bond wires 854. Similarly, the drain lead 824A may be connected to the output matching circuit 852 by one or more bond wires 854, and the output matching circuit 852 may be connected to the drain terminal 134 of RF transistor amplifier die 1000 by one or more additional bond wires 854. The bond wires 854, which are inductive elements, may form part of the input and/or output matching circuits.

FIG. 8B is a schematic side view of a packaged Group III nitride-based RF transistor amplifier 800B that includes the transistor device 1000 packaged in a printed circuit board based package structure 810B. The packaged RF transistor amplifier 800B is very similar to the packaged RF transistor amplifier 800A of FIG. 8A, except that the gate and drain leads 822A, 824A of package structure 810A are replaced with printed circuit board based leads 822B, 824B in package structure 810B.

The package structure 810B includes a submount 830, ceramic sidewalls 840, a ceramic lid 842, each of which may be substantially identical to the like numbered elements of package structure 810A discussed above. The package structure 810B further includes a printed circuit board 820. Conductive traces on the printed circuit board 820 form a metal gate lead 822B and a metal drain lead 824B. The printed circuit board 820 may be attached to the submount 830 via, for example, a conductive glue. The printed circuit board 820 includes a central opening and the RF transistor amplifier die 1000 is mounted within this opening on the submount 830. Other components of RF transistor amplifier 800B may be the same as the like-numbered components of RF transistor amplifier 800A, and hence further description thereof will be omitted.

FIG. 8C is a schematic side view of another packaged Group III nitride-based RF transistor amplifier 800C. RF transistor amplifier 800C differs from RF transistor amplifier 800A in that it includes a different package structure 810C. The package structure 810C includes a metal submount 830 (which may be similar or identical to the submount 830 of package structure 810A), as well as metal gate and drain leads 822C, 824C. RF transistor amplifier 800C also includes a plastic overmold 860 that at least partially surrounds the RF transistor amplifier die 1000, the leads 822C, 824C, and the metal submount 830. Other components of RF transistor amplifier 800C may be the same as the like-numbered components of RF transistor amplifier 800A and hence further description thereof will be omitted.

The present invention is described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

In the drawings and specification, there have been disclosed typical embodiments of the invention, and, although specific terms have been employed, they have been used in a generic and descriptive sense only and not for purposes of limitation.

That which is claimed:

1. A transistor device, comprising:
a semiconductor structure comprising a channel layer and a barrier layer;
source and drain contacts on the semiconductor structure; and
a gate on the semiconductor structure between the source and drain contacts,
wherein a first portion of the barrier layer extending between the source or drain contact and the gate has a first thickness,
wherein a second portion of the barrier layer between the gate and the channel layer comprises a floor of a gate recess and has a second thickness, and
wherein the second thickness is less than a third thickness of the barrier layer at corner portions of the gate recess between the floor and opposing sidewalls of the gate recess.

2. The transistor device of claim 1, wherein the first thickness is about 150 Å to 300 Å, and the second thickness is about 30 Å to 150 Å.

3. The transistor device of claim 1, wherein a surface roughness along the floor of the gate recess is less than about 3 Å.

4. The transistor device of claim 1, wherein the floor of the gate recess defines a length of the gate between the source and drain contacts, and a ratio of the length of the gate to the second thickness is about 10:1 or less.

5. The transistor device of claim 4, wherein the length of the gate is less than about 100 nanometers (nm).

6. The transistor device of claim 1, wherein the opposing sidewalls respectively comprise a first portion defining an angle of about 85 degrees to about 95 degrees relative to the floor, and a second portion defining an angle of about 40 degrees to 50 degrees relative to the floor.

7. The transistor device of claim 1, wherein a peak transconductance ($g_m$) of the transistor device is about 450 mS/mm to 800 mS/mm, and an on-resistance of the transistor device is about 1.5 Ω-mm to 3 Ω-mm.

8. A transistor device, comprising:
a semiconductor structure comprising a channel layer and a barrier layer; and
source and drain contacts and a gate therebetween on the semiconductor structure,
wherein the barrier layer comprises a gate recess including the gate therein, and wherein a surface roughness along a floor of the gate recess is less than about 3 Angstroms (Å).

9. The transistor device of claim 8, wherein the barrier layer comprises a gallium-based material.

10. The transistor device of claim 9, wherein a first thickness of the barrier layer at corner portions of the gate recess adjacent between the floor and opposing sidewalls thereof is greater than a second thickness of the barrier layer at the floor of the gate recess.

11. The transistor device of claim 10, wherein the opposing sidewalls respectively comprise a first portion defining an angle of about 85 degrees to about 95 degrees relative to the floor, and a second portion defining an angle of about 40 degrees to 50 degrees relative to the floor.

12. The transistor device of claim 10, wherein a third thickness of a portion of the barrier layer extending between the source or drain contact and the gate is about 1.5 times to 4 times greater than the second thickness, and a ratio of a length of the gate along the floor of the gate recess to the second thickness is about 10:1 or less.

13. A transistor device, comprising:
a semiconductor structure comprising a channel layer and a barrier layer; and
source and drain contacts and a gate therebetween on the semiconductor structure,
wherein a first portion of the barrier layer extending between the source or drain contact and the gate has a first thickness, a second portion of the barrier layer between the gate and the channel layer has a second thickness and defines a length of the gate between the source and drain contacts, and a ratio of the length of the gate to the second thickness is about 10:1 or less.

14. The transistor device of claim 13, wherein the first thickness is about 1.5 times to 4 times greater than the second thickness.

15. The transistor device of claim 14, wherein the first thickness is about 150 Å to 300 Å, and the second thickness is about 30 Å to 150 Å.

16. The transistor device of claim 13, wherein the length of the gate is less than about 100 nanometers (nm).

17. The transistor device of claim 13, wherein a peak transconductance ($g_m$) of the transistor device is about 450 mS/mm to 800 mS/mm.

18. The transistor device of claim 17, wherein the channel layer and the barrier layer comprise a gallium-based material.

19. The transistor device of claim 13, wherein the first thickness is about 1.5 times to 4 times greater than the second thickness.

20. A transistor device, comprising:
a semiconductor structure comprising a channel layer and a barrier layer; and
source and drain contacts and a gate therebetween on the semiconductor structure,
wherein the barrier layer comprises a gate recess including the gate therein, the gate recess comprises opposing sidewalls and a floor therebetween,
and wherein edges of the gate recess between the floor and the opposing sidewalls comprise inclined surfaces, and the floor of the gate recess comprises a substantially planar surface that is between the inclined surfaces.

21. The transistor device of claim 20, wherein the opposing sidewalls respectively comprise a first portion defining an angle of about 85 degrees to about 95 degrees relative to the floor, and a second portion comprising the inclined surfaces having an angle of about 40 degrees to 50 degrees relative to the floor.

22. The transistor device of claim 20, wherein a first thickness of the barrier layer at the edges of the gate recess is greater than a second thickness of the barrier layer at the floor of the gate recess therebetween, a third thickness of a portion of the barrier layer extending between the source or drain contact and the gate is about 1.5 times to 4 times greater than the second thickness, and a ratio of a length of the gate along the floor of the gate recess to the second thickness is about 10:1 or less.

23. The transistor device of claim 20, wherein a surface roughness along the floor of the gate recess is less than about 3 Å.

24. A method of fabricating a transistor device, the method comprising:
   providing a semiconductor structure comprising a channel layer and a barrier layer;
   performing a looped recess process comprising a plurality of loops to define a gate recess in the barrier layer, wherein each of the loops comprises an adsorption process and a desorption process configured to remove a monolayer of the barrier layer; and
   forming a gate in the gate recess.

25. The method of claim 24, wherein each of the loops comprises the adsorption process and the desorption process with a purge process therebetween, wherein the adsorption process is chlorine-based, the desorption process is argon-based, and the purge process is helium- or nitrogen-based.

26. The method of claim 24, wherein the looped recess process is a plasma etch process that is performed using an inductively-coupled plasma tool with a peak-to-peak voltage of about 70 V to 110 V.

27. The method of claim 24, wherein, responsive to performing the looped recess process, a surface roughness along a floor of the gate recess is less than about 3 Å.

28. The method of claim 24, wherein, responsive to performing the looped recess process, a first thickness of the barrier layer at corner portions of the gate recess between a floor and opposing sidewalls thereof is greater than a second thickness of the barrier layer at the floor of the gate recess.

* * * * *

UNITED STATES PATENT AND TRADEMARK OFFICE
CERTIFICATE OF CORRECTION

PATENT NO. : 12,382,699 B2  
APPLICATION NO. : 17/834144  
DATED : August 5, 2025  
INVENTOR(S) : Hardiman et al.

Page 1 of 1

It is certified that error appears in the above-identified patent and that said Letters Patent is hereby corrected as shown below:

In the Specification

Column 8, Line 1: Please correct "(NiSix)" to read --$(NiSi_x)$--

Column 8, Line 13: Please correct "NiSix" to read --$NiSi_x$--

Column 14, Line 27: Please correct "in A" to read --in Å--

Column 17, Line 47: Please correct "SiNx" to read --$SiN_x$--

Signed and Sealed this  
Eleventh Day of November, 2025

John A. Squires  
*Director of the United States Patent and Trademark Office*